United States Patent [19] … [11] Patent Number: 5,036,017
Noda … [45] Date of Patent: Jul. 30, 1991

[54] METHOD OF MAKING ASYMMETRICAL FIELD EFFECT TRANSISTOR

[75] Inventor: Minoru Noda, Itami, Japan

[73] Assignee: Mitsubishi Denki Kabushiki Kaisha, Japan

[21] Appl. No.: 441,898

[22] Filed: Nov. 27, 1989

[30] Foreign Application Priority Data

Nov. 29, 1988 [JP] Japan ............... 63-302531

[51] Int. Cl.5 .............. H01L 21/265; H01L 21/44; H01L 29/22; H01L 29/78
[52] U.S. Cl. ............................. 437/41; 437/39; 437/175; 437/913; 437/912; 437/983; 437/984; 357/23.2; 357/23.9; 357/22
[58] Field of Search ............ 437/29, 40, 41, 107, 437/192, 201, 912, 913, 983, 984, 175, 176, 245; 357/23.9, 23.2, 22 I, 22 J, 23.2, 91

[56] References Cited

U.S. PATENT DOCUMENTS

| | | | |
|---|---|---|---|
| 4,532,698 | 8/1985 | Fang et al. | 437/913 |
| 4,645,563 | 2/1987 | Terada | 437/41 |
| 4,700,455 | 10/1987 | Shimada et al. | 437/41 |
| 4,701,422 | 10/1987 | Elliott | 357/91 |
| 4,769,339 | 9/1988 | Ishii | 437/41 |
| 4,839,304 | 6/1989 | Morikawa | 437/29 |
| 4,902,646 | 2/1990 | Kakano | 437/41 |

FOREIGN PATENT DOCUMENTS 61-80869 4/1986 Japan .
62-86870 4/1987 Japan .
62-166571 7/1987 Japan .

OTHER PUBLICATIONS

"Asymmetric Implantation Self-Alignment Technique for GaAs MESFETs", Kimura et al, Jap. J. Appl. Phys., vol. 27, #7, Jul. 1988, pp. L1340-L1343.

Primary Examiner—Rolf Hille
Assistant Examiner—Mahshid Saadat
Attorney, Agent, or Firm—Leydig, Voit & Mayer

[57] ABSTRACT

A method of making a field effect transistor includes forming an active layer in a semiconductor substrate, forming a gate material on a portion of the surface as an ion implantation mask, implanting dopant ions to form a source region, depositing a first mask over the source region and a portion of the gate material, and removing the unmasked gate material to define a gate electrode. A second mask is deposited adjacent the gate electrode opposite the source region, and dopant impurities are implanted to form a drain region using the mask. The source and drain regions are asymmetrically doped and the gate electrode is asymmetrically disposed relative to the source and drain regions in the self-aligning process.

16 Claims, 6 Drawing Sheets

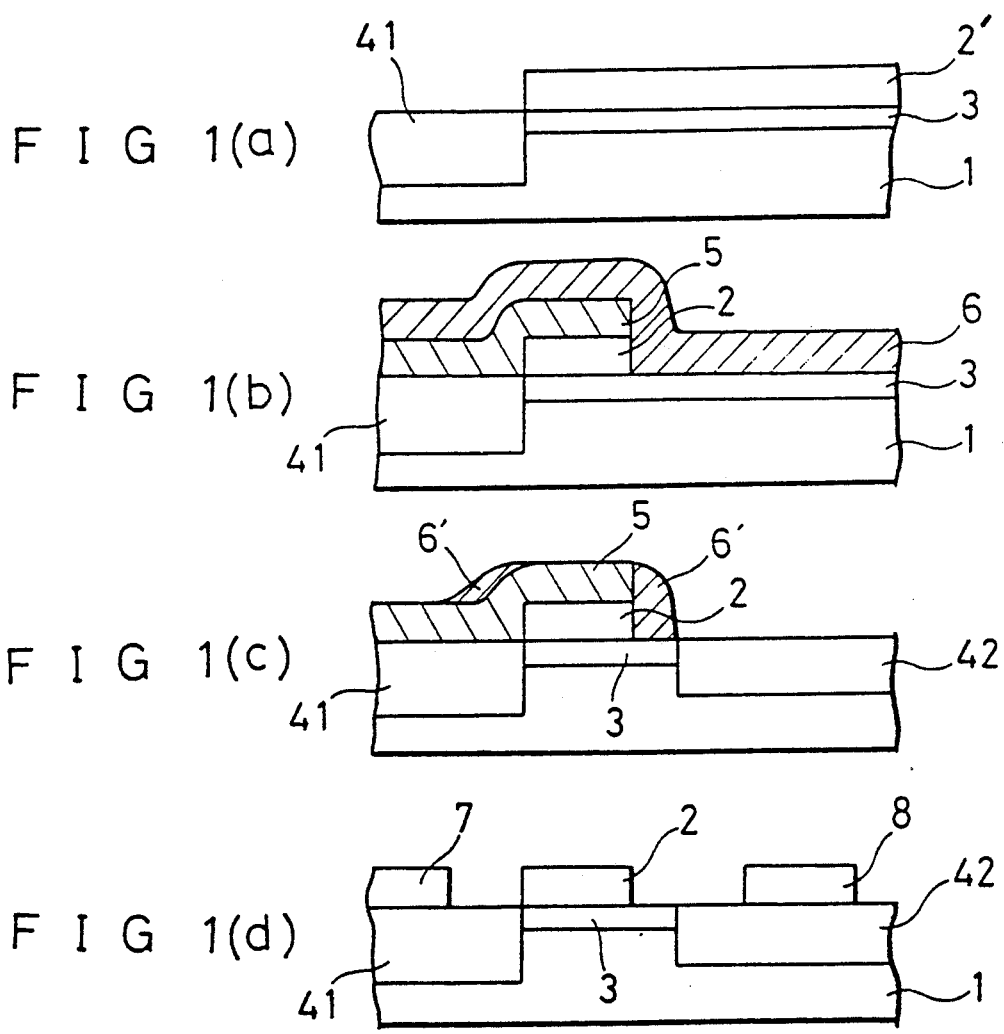

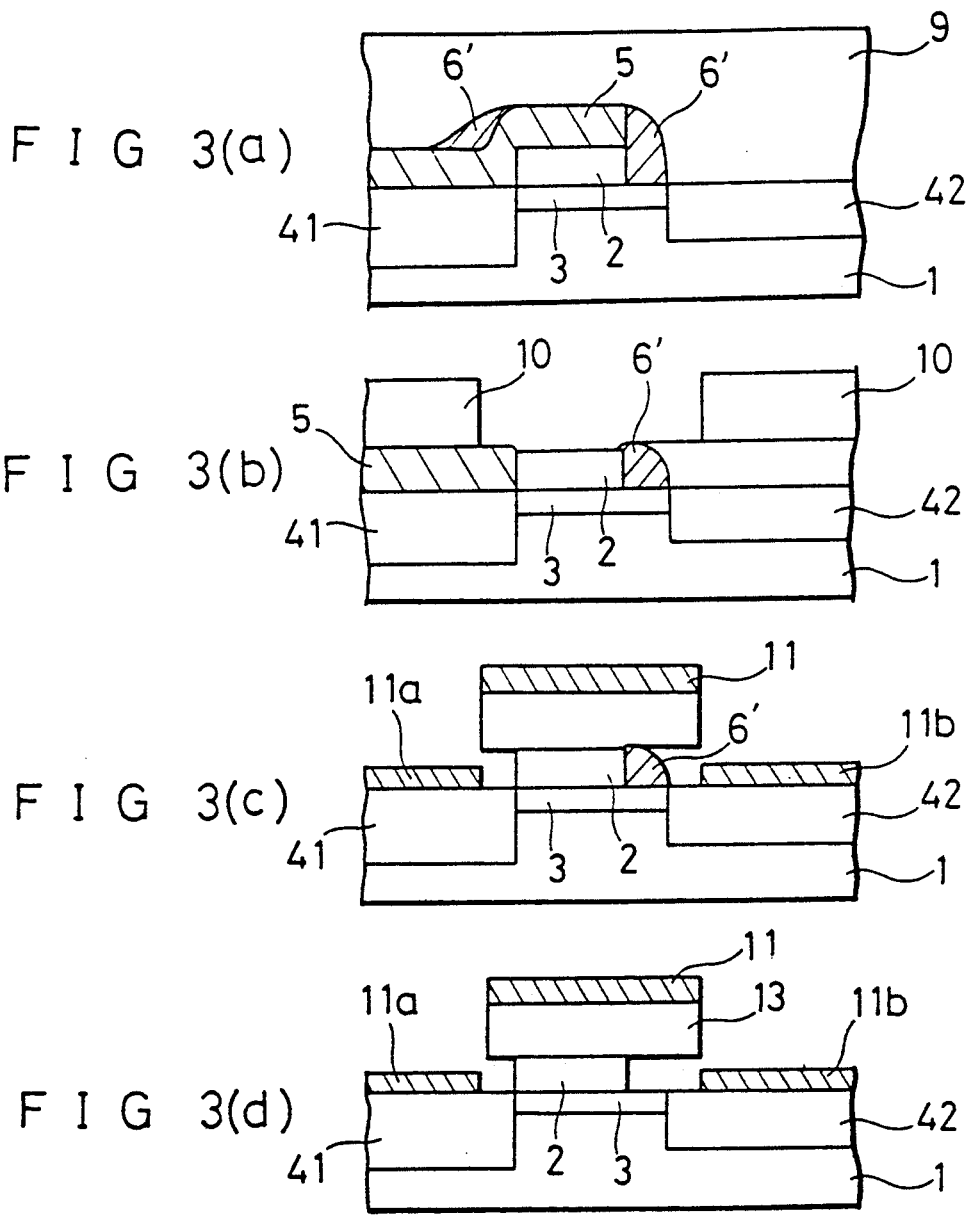

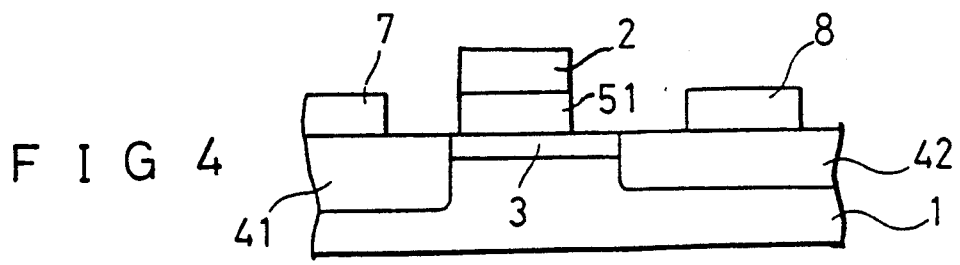
FIG 4
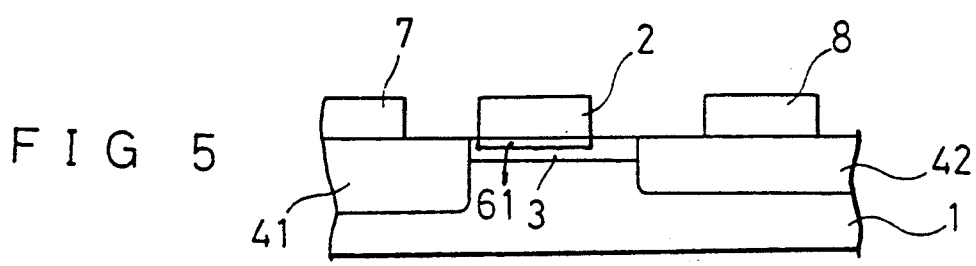
FIG 5
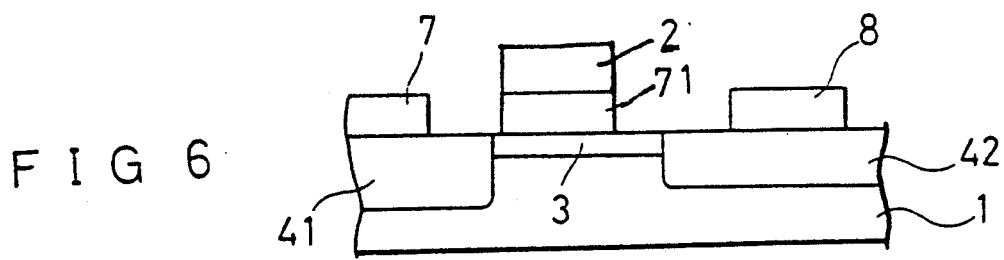
FIG 6
FIG 11 (PRIOR ART)
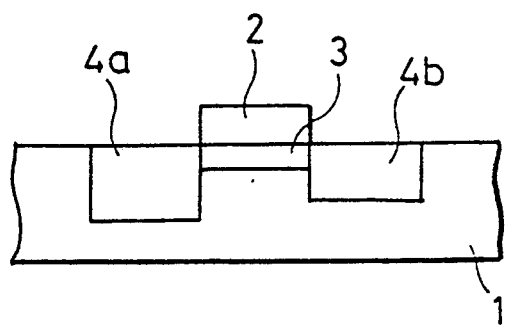

(PRIOR ART)

METHOD OF MAKING ASYMMETRICAL FIELD EFFECT TRANSISTOR

FIELD OF THE INVENTION

The present invention relates to a method of producing asymmetrical field effect transistors and to asymmetrical field effect transistors produced according to the method.

BACKGROUND OF THE INVENTION

Field effect transistors (FETs) employing compound semiconductors, such as gallium arsenide (GaAs) and indium phosphide (InP) are useful as high frequency transistors because electron mobilities in those semiconductors are relatively high. A conventional self-aligned field effect transistor in which the gate electrode is symmetrically disposed between the source and drain of the type described in Japanese Published Patent Application No. 62-166571 is shown in cross-section in FIG. 7. The gate electrode 2 is disposed on the surface of a semiconductor substrate 1 at an active layer 3 of the substrate. The active layer 3 generally has a relatively high conductivity and, in preferred embodiments, substrate 1 has a high resistivity and may be semi-insulating. The active layer 3 interconnects source and drain regions 4a and 4b. In the conventional self-aligned process, the gate electrode 2 is used as an ion implantation mask. As a result, the sides of the gate electrode 2 are aligned with the interfaces between the active layer 3 and the source and drain regions 4a and 4b. Generally, the gate electrode 2 is a heat-resistance material, such as a refractory metal or an alloy containing a refractory metal.

The FET structure of FIG. 7 has a relatively low gate-to-source resistance and good current-drive capability because the gate electrode 2 is directly adjacent the source and drain regions. However, when the FET of FIG. 7 is reduced in size, it can suffer from so-called short channel effects. Those within the active layer 3 when the same voltages are applied to a device with reduced channel length as are applied to devices with longer channel lengths. The strong electric field results in saturation of the velocity of the electrons traveling between the source and drain regions, limiting the transconductance and frequency response of the device. The positioning of the gate electrode 2 adjacent to the drain region 4b also limits the drain breakdown voltage to an undesirably low value. The low drain breakdown voltage limits the utility of the FET in linear integrated circuits and as a linear circuit element.

Another self-aligned FET structure of the type shown in FIG. 8 is also disclosed in Japanese Published Patent Application No. 62-166571. The elements of the structure of FIG. 8 are identical to those of the structure of FIG. 7 except that gate electrode 2 is symmetrically spaced from each of the source and drain regions 4a and 4b. The structure of FIG. 8 is produced in a self-aligned process by including ion implantation masks adjacent to the gate electrode 2 so that the source and drain regions are spaced suppresses the short channel effects because of the wide spacing between gate and source and that between the gate and drain. The separation of the gate electrode from the source and drain regions 4a and 4b increases the drain breakdown voltage but undesirably increases the gate-to-source resistance and reduces the current-drive capability of the device.

In response to these problems, an FET structure including a gate electrode that is asymmetrically disposed with respect to the source and drain regions has been proposed. One such proposed structure is shown in FIG. 9. In that structure, a groove is formed in the active layer 3 and the gate electrode 2 is asymmetrically disposed within the groove. This asymmetrically disposed gate electrode FET has a disadvantage in that it is not a self-aligned structure. However, the relatively small distance between the gate electrode 2 and the source region 4a results in a reduced gate-to-source resistance with a relatively high current-drive capability. The relatively large spacing between the gate electrode 2 and the drain region 4b increases the drain breakdown voltage. As a result, the transconductance of the FET is improved relative to the symmetrical gate structures of FIG. 7. However, it is difficult to repeatedly produce uniform FET structures like that of FIG. 9 in the absence of a self-aligned gate processing technique.

A method of making an FET with an asymmetrically disposed gate electrode and a relatively short gate length is described in Japanese Published Patent Application No. 62-86870 and illustrated in FIGS. 10(a) to 10(f). As shown in FIG. 10(a), a semi-insulating substrate 21 has an active layer 22 formed at the surface of the substrate. When the substrate 21 is GaAs, the active layer 22 is typically formed by ion implantation of silicon. A gate material 23, such as a refractory metal silicide, and an insulating film 28, for example, of silicon dioxide, are successively deposited on active layer 22. The gate material 23 and the insulating film 28 are formed into a desired gate electrode structure having a length corresponding to the drain-to-source region spacing. The gate length is defined by conventional photolithography techniques to produce the structure of FIG. 10(b).

A mask 29, such as a photoresist, is deposited to cover a portion of the active layer 22 where the source region will be produced on one side of the gate material 23 and on part of the top surface of the insulating film 28. The mask 29 is formed into the desired pattern by conventional techniques, leaving part of insulating film 28 exposed as illustrated in FIG. 10(c). That exposed portion of insulating film 28 is removed, for example, by etching, after which mask 29 is removed. Dopant ions are then implanted into the substrate 21 for a second time at a higher energy and with a larger dosage than employed to produce the active layer 22. This ion implantation step, which is conventionally followed by annealing, produces the structure of FIG. 10(d).

The asymmetrical disposition of the gate electrode relative to the source and drain regions 24 and 25 is completed by the removal of the portion of the gate material 23 that is not protected by the insulating film 28. The excess gate material is removed by wet or dry etching to produce the structure of FIG. 10(e). The insulating film mask 28 is subsequently removed and source and drain electrodes 26 and 27 are deposited on source and drain regions 24 and 25, respectively. The completed device structure, shown schematically in FIG. 10(f), includes the asymmetrically disposed gate electrode 23. Because the gate electrode is adjacent to the interface of the source region 24 with the active layer 22, the gate-to-source resistance is relatively low. The spacing between the gate electrode 23 and the drain region 25 enhances the current-drive capability and gate-to-drain breakdown voltage of the FET. However, the precise spacing between the gate electrode 23 and the drain region 25 is determined by the etching of the side wall of the gate electrode 23, a process that is difficult to control. Accordingly, the structure of FIG. 10(f) is difficult to reproduce uniformly. In addition, the exposure of a portion of the active layer 22 adjacent to the gate electrode 23 and all of the drain region 25 to a plasma when the unmasked portion of the gate material is dry etched damages the FET and degrades its performance.

In the FET structures of FIGS. 7-9 and 10(f), the formation of the source and drain regions is carried out simultaneously by ion implantation. As a result, those regions are generally symmetrical with respect to their depths and dopant concentrations. Another FET structure for suppressing short channel effects employs asymmetrically doped source and drain regions. Such a structure is shown in cross-section in FIG. 11 taken from FIG. 4 of Kimura et al, "Asymmetrical Implantation Self-alignment Technique For GaAs MESFETs", Japanese Journal of Applied Physics, Volume 27, No. 7, July 1988, pages L1340 to L1343. The self-aligned structure of FIG. 11 includes a source region 4A that is more heavily doped and deeper than is the drain region 4b. That result is achieved by carrying out three ion implantation steps in the course of making the FET rather than the two implantation steps employed in making the structures described above.

The structure of FIG. 11 is produced by masking a gate electrode 2 disposed on an active layer 3 formed in a substrate 1. The gate electrode 2 and the substrate are masked with an ion implantation mask material, such as germanium. An aperture is opened in the ion implantation mask near the gate electrode using a photoresist mask. Thereafter, ions are implanted through the aperture and in any adjacent areas where the implantation mask has been removed by side wall etching of the mask during opening of the aperture. Subsequently, the drain region is doped in another ion implantation step.

The method of making the asymmetrically doped FET disclosed by Kimura et al requires etching of the ion implantation mask beneath a photoresist mask. Complete removal of the ion implantation mask by side wall etching beneath the photoresist mask is essential to obtaining self-alignment of the source region and the gate electrode. Insufficient side wall etching can result in a non-uniform and undesired doping profile in the substrate. Excessive etching can result in damage to the gate electrode. Therefore, it is difficult to control processing and achieve uniformly reproducible results.

Accordingly, it is desirable to provide a process for self-aligningly producing field effect transistor structures incorporating the advantageous elements of the prior art structures but which is free of steps that are difficult to control and which affect the characteristics of the completed devices. In addition, it is desirable to provide new field effect transistor device structures produced by the novel method.

SUMMARY OF THE INVENTION

An object of the present invention is to provide a method of producing an FET having a high drain breakdown voltage, high current-drive capability, low gate-to-source resistance, and self-aligned features that can be used to manufacture FETs with good reproducibility.

A further object of the present invention is to provide FETs made according to the novel method.

In accordance with the present invention, an active layer is formed in a semiconductor substrate at its surface. A gate material is formed on a portion of the surface of the substrate as an ion implantation mask. Dopant ions are implanted into the portion of the substrate not covered by the gate material to form a source region. A first mask is deposited over the source region and a portion of the gate material to protect them during removal of the unmasked gate material to define a gate electrode. A second mask is deposited on the exposed surface of the substrate adjacent to the gate electrode on the side opposite the source region. A drain region is formed adjacent to the gate electrode in the substrate by implanting dopant atoms using the first and second masks as ion implantation masks. After removal of the first and second masks, source and drain electrodes are deposited on the substrate at the source and drain regions, respectively.

Preferably, the source region contains a larger concentration of dopant atoms than the drain region. The ion implantation steps combined with the masking steps ensure that the gate electrode is spaced from the drain region. The gate electrode may also be spaced from the source region by temporarily including a spacing film on the substrate adjacent to the gate material before forming the source region. The spacing film is removed after the source region is formed by ion implantation. By employing a third mask over the substrate after forming the drain region, a low resistance contact layer having a larger area than the gate electrode may be deposited on the gate electrode for reducing the gate resistance.

Field effect transistors made according to the invention include a substrate having a surface, source and drain regions disposed in the substrate at the surface, and an active layer of the same conductivity type as the source and drain regions in the substrate and interconnecting those regions wherein a gate electrode disposed on the active layer is spaced from the interfaces of the active layer with the source and drain regions and the source region has a higher doping concentration than the drain region. Preferably, the gate electrode is spaced farther from the drain region than from the source region. The gate electrode may include a semiconductor material disposed on or in the active layer and forming a rectifying junction with it. Alternatively, an electrical insulator may be disposed between the active layer and the gate electrode, particularly when the substrate is InP.

The method and FETs according to the invention are self-aligned and produce a reduced gate-to-source resistance and an increased drain breakdown voltage with a high current-drive capability. The method of producing FETs does not include a critical gate electrode or ion mask etching step that controls the characteristics of the FETs. Therefore, the invention can reproduce FETs having desired structures and characteristics uniformly.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

BRIEF DESCRIPTION OF THE DRAWINGS

FIGS. 1(a) to 1(d) are cross-sectional views illustrating major steps in a method for producing a field effect transistor according to an embodiment of the invention.

FIGS. 3(a) to 3(d) are cross-sectional views illustrating major steps in a method for producing a field effect transistor according to an embodiment of the invention.

FIGS. 4, 5, and 6 are cross-sectional views of field effect transistor structures according to embodiments of the invention.

FIGS. 7, 8, 9, and 11 are cross-sectional views of structures of field effect transistors.

DETAILED DESCRIPTION OF PREFERRED EMBODIMENTS

Figure 2A:
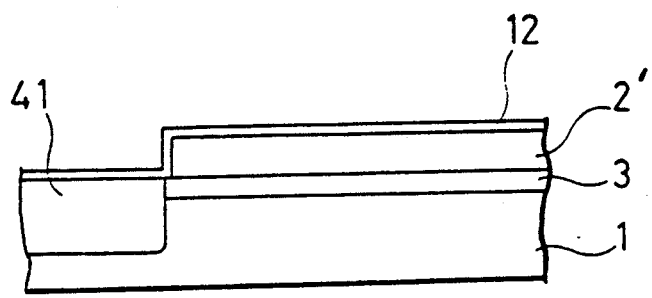
FIGS. 2(a) to 2(d) are cross-sectional views illustrating major steps in a method for producing a field effect transistor according to an embodiment of the invention.

A process for producing an FET according to the invention is illustrated in FIGS. 1(a) to 1(d). A semi-insulating GaAs substrate 1 first has deposited on it a protective insulating layer (not shown) of, for example, SiO, SiON, or SiN, to a thickness of several hundred Angstroms. By comparison, the GaAs substrate 1 typically has a thickness of about 600 microns. With the protective film in place, silicon ions with energies of about 30 to 50 KeV and a dosage level of about 1 to $6 \times 10^{12}$ cm$^{-2}$ are implanted into the substrate 1. The implantation is followed by annealing to activate the implanted species. The protective insulating layer is then removed, for example, by etching. The ion implantation step produces an active layer 3 within the body of the substrate and at its surface.

A gate material 2', for example, a refractory metal or a refractory metal alloy such as WN, WAl, WSi, or W, is formed on a portion of the surface of the substrate where the active layer is present. The gate material is deposited by sputtering or a chemical vapor deposition (CVD) method to a thickness of about 0.2 to 0.5 micron. The gate material covers only a portion of the surface of the substrate 1 through controlled deposition, by etching, or by the lift-off technique. Using the gate material 2' as an ion implantation mask, silicon or selenium ions are implanted in the unmasked portion of the substrate 1 at energies of about 50 to 100 KeV and a dosage exceeding about $1 \times 10^{13}$ cm$^{-2}$. This implantation of dopant ions forms a relatively high dopant concentration source region 41 in substrate 1. Preferably immediately after this second ion implantation step, the substrate is annealed at about 800 degrees Centigrade in an ambient of arsine, if substrate 1 is GaAs, to activate the implanted species. The resulting structure is illustrated in FIG. 1(a).

The gate material 2' is defined as a gate electrode 2 by applying an etching mask 5, such as a photoresist, over the source region 41 and part of the gate material 2'. The portion of the gate material 2' that is not protected by mask 5 is removed by etching, preferably by dry etching such as reactive ion etching (RIE) or electron cyclotron resonance etching (ECR). Once the gate electrode 2 has been defined, a second mask 6, preferably an insulating film, such as SiN, SiO$_2$, SiO, or SiON, is deposited on the entire surface of the substrate 1, including on the remaining part of mask 5, as illustrated in FIG. 1(b).

As shown in FIG. 1(c), the portion of the second mask 6 opposite the active layer 3 on the drain side of the gate electrode 2, i.e., the side opposite the source region 41, is removed by dry etching. Preferably, an anisotropic dry etching technique, such as RIE or ECR etching using a fluorine-containing gas such as CF$_6$, NF$_3$, or SF$_6$, with oxygen, is used. A portion 6' of the insulating film 6 is left in place adjacent to and contiguous with gate electrode 2 over active layer 3, i.e., at the side wall of the gate electrode 2. By controlled etching, the transverse width of the non-metallic film portion 6' left at the side of gate electrode 2 is reduced to a desired dimension extending from the gate electrode 2. That dimension and the width of gate electrode 2 determine the channel length in the final FET device and the spacing between the drain region and the gate electrode 2. Using the second mask portion 6' and the mask 5 as implantation masks, silicon or selenium ions are implanted into the substrate at energies of about 50 KeV to a dosage below $1 \times 10^{13}$ cm$^{-2}$ to form a relatively low dopant concentration drain region 42. Both the source region 41 and the drain region 42 have a higher dopant concentration than the active layer 3. However, the dopant concentration in the drain region 42 is low relative to the dopant concentration of the source region 41.

After the third ion implantation step, the remaining portions of the first and second masks 5 and 6' are removed. Again, the structure is annealed at 800 degrees Centigrade for several minutes or several tens of minutes in arsine, if substrate 1 is GaAs, to activate the implanted dopant atoms. Preferably, the source region 41 is annealed at the stage of production shown in FIG. 1(a). However, that annealing step can be postponed and carried out at the same time the drain region 42 is annealed. The arsine ambient provides an arsenic overpressure that is needed when substrate 1 is GaAs in order to avoid loss of arsenic from the substrate during annealing.

The completed field effect transistor is shown in FIG. 1(d) where a source electrode 7 and a drain electrode 8 have been deposited on the source region 41 and the drain region 42, respectively. Those electrodes are typically multiple layers of metals or alloys, such as gold/germanium/nickel/gold or germanium/nickel/gold.

The process described above is self-aligning as to the source region 41 since the gate material 2' is employed as an ion implantation mask. Preferably, there is a slight offset between the gate electrode 2 and the interface between the active layer 3 and the source region 41. The offset is preferably less than 0.2 micron. That offset can be assured by employing the production method described with respect to FIGS. 2(a) through 2(d) below. The process of FIGS. 1(a) to 1(d) is self-aligning as to the drain region 42 since the second masking portion 6' is employed as an ion implantation mask. As shown in FIG. 1(d), the spacing between the gate electrode 2 and the interface between the drain region 42 and the active layer 3 is much wider than 0.2 micron. That separation can be readily controlled in the invention to a greater precision than is achieved in the known processes. As a result, a field effect transistor with an asymmetrically disposed gate electrode and asymmetrically doped source and drain regions can be reproducibly manufactured with a low gate-to-source resistance and high drain breakdown voltage and current-drive capability.

The large current-drive capability makes the FET useful in linear and digital integrated circuits.

Referring to FIG. 2(a), the same steps described for the structure of FIG. 1(a) up to the first ion implantation step are carried out. Since those steps have already been described, there is no need to describe them a second time. Before the ion implantation step that produces source region 41, a spacing film 12, such as SiO, SiN, SiON, or $SiO_2$, is deposited to a thickness less than about 0.25 micron on the exposed surface of the substrate 1 and on the gate material 2'. Thereafter, the same first ion implantation step already described with respect to FIG. 1(a) is carried out to produce the source region 41. Immediately thereafter, the insulating film 12 is removed, for example, by etching, and annealing of the implanted layer is carried out.

Figure 2B:
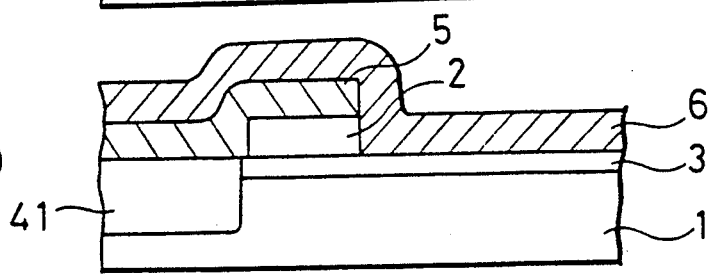
Figure 2C:
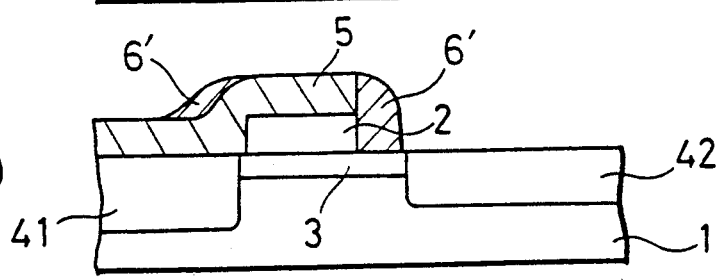
Figure 2D:
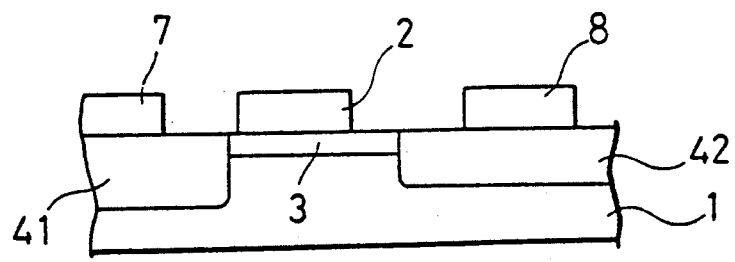
Figure 10A:
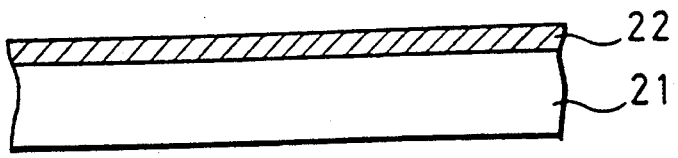
FIGS. 10(a) to 10(f) are cross-sectional views illustrating steps of a known method for producing field effect transistors.
Figure 10B:
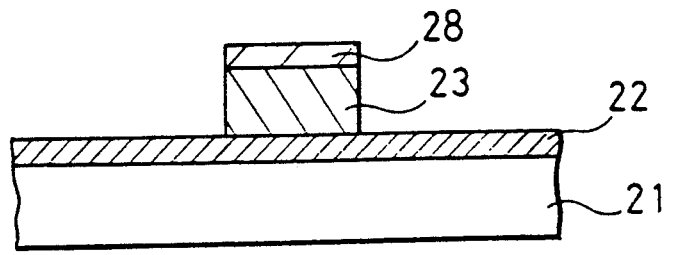
Figure 10C:
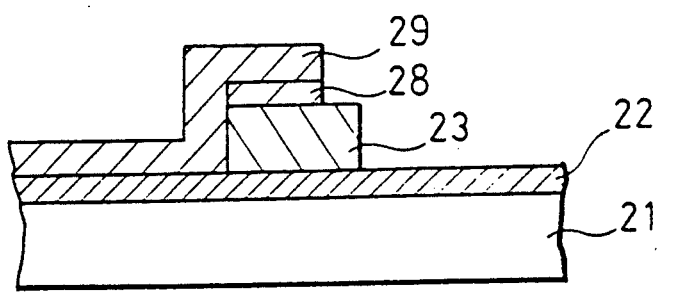
Figure 10D:
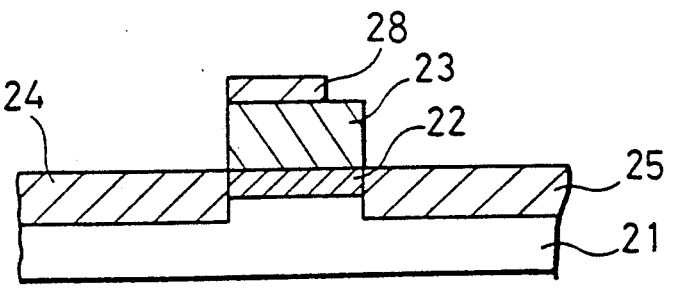
Figure 10E:
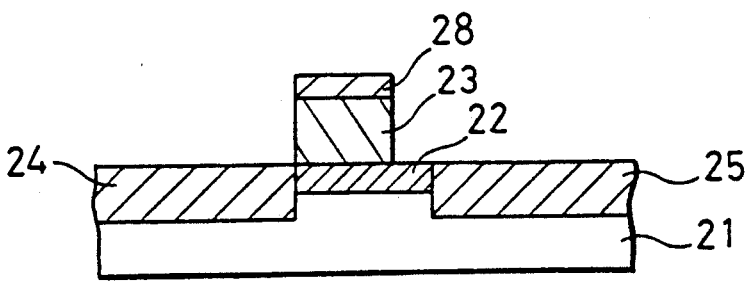
Figure 10F:
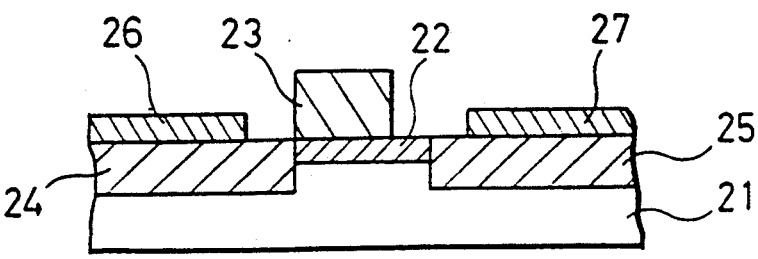
Figure 7:
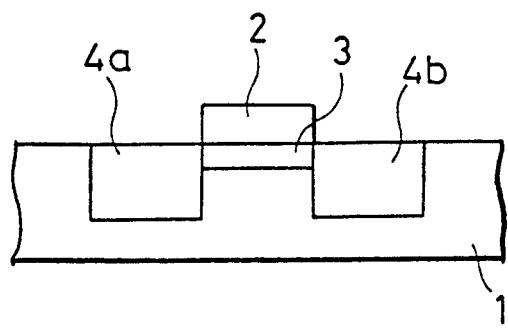
Figure 8:
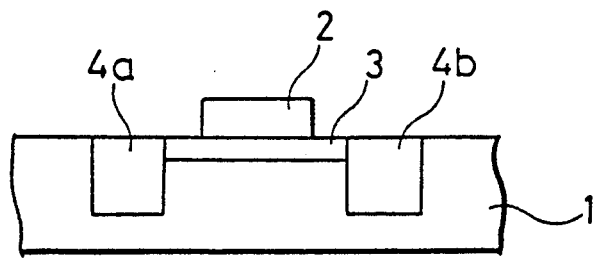
Figure 9:
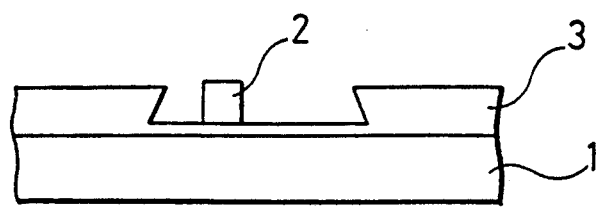

The subsequent processing steps represented by FIGS. 2(b) to 2(d) are the same as those already described with respect to FIGS. 1(b) to 1(d). However, the structure produced is slightly different from that of FIG. 1(d) since the temporary presence of spacing film 12 ensures that the gate electrode 2 is spaced from the interface of the active layer 3 and the source region 41. The same advantages of self-alignment, high current-drive capability, and high drain breakdown voltage are achieved as in the structures of FIGS. 1(d) and 2(d).

FIGS. 3(a) to 3(d) show cross-sections illustrating another process for producing a field effect transistor according to the invention. The same process steps employed in FIGS. 1(a) to 1(c) are employed in the process illustrated in FIG. 3(a). In the processing stage shown in FIG. 3(a), all of the steps to produce the structure of FIG. 1(c) have already been completed. In addition to those steps, a masking material, such as a photoresist, having a relatively low viscosity has been deposited over the substrate as a mask 9. The mask 9 has a surface opposite substrate 1 that is relatively planar, as shown in FIG. 3(a).

A dry etching step is carried out as illustrated in FIG. 3(b), removing a portion of the mask 9 and the underlying mask 5 and the mask portion 6' opposite the gate electrode 2 to leave an apertured mask 10. That etching step opens an aperture that exposes the gate electrode 2 but is larger in area than that electrode. The etching is preferably ion etching using a gas mixture including a fluorine-containing gas such as $CF_4$ in combination with oxygen. Preferably, the etching conditions are selected so that the film 9, the resist 5, and the mask portion 6' are etched at substantially equal rates.

The apertured mask 10 of FIG. 3(b) is employed as shown in FIG. 3(c) to deposit a low resistance contact on the exposed gate electrode 2 and the adjacent exposed part of mask 5 and the mask portion 6'. Typically, the low resistance contact 13 includes several layers of metal, such as titanium/platinum/gold. Excess metal deposited in this step is removed by the lift-off technique, i.e., by dissolving the apertured mask 10 and the mask 5. The portion 6' of the second mask is generally not removed during that dissolution step. Finally, source and drain electrodes 11a and 11b are deposited on the source and drain regions 41 and 42, respectively. At the same time, the electrode metals are deposited on top of the low resistance contact 13 on the gate electrode 2. That contact 13 acts as a mask for the deposition of the drain and source electrodes. The drain and source electrodes 11a and 11b are typically several layers of metal, for example, gold/germanium/nickel/-gold or gold/nickel/gold. The addition of the low resistance contact 13 on the gate electrode 2 reduces the gate resistance and improves the high frequency performance of the FET. As illustrated in FIG. 3(d), etching mask portion 6' is ultimately removed from the device structure by chemical etching. However, that portion 6' may optionally be left in place to reduce current leakage in the device.

The structure of FIG. 3(d) includes the self-aligning feature so that the gate electrode 2 is aligned with the interface between source region 41 and active layer 3. By incorporating the process steps of FIGS. 2(a) and 2(b), i.e., including the temporary spacing film 12, the source region/active layer interface may be reliably spaced from the side of the gate electrode 2.

The devices illustrated and described above are metal Schottky barrier field effect transistors (MESFETs) in which a Schottky barrier is formed between the gate electrode 2 and the active layer 3. However, the invention may be widely applied to other FET structures, such as those shown in FIGS. 4, 5, and 6.

Turning to FIG. 4, a junction FET is schematically shown in cross-section. The elements of that device are the same as those described with respect to FIG. 1(d) and are given the same reference numerals with the exception of layer 51. Layer 51 is a semiconductor material having a conductivity type opposite that of the active layer 3 and forms a rectifying junction with it. In a preferred embodiment, the active layer 3 is n-type so that the layer 51 interposed between the gate electrode 2 and the active layer 3 is p-type. The structure of FIG. 4 may be produced with any of the methods described with respect to FIGS. 1, 2, and 3 by adding a step in which a doped layer from which element 51 is made is deposited after the implantation of the active layer 3 and before the deposition of the gate material 2'. The particular structure shown in FIG. 4, like the structures shown in FIGS. 5 and 6, employs a gate that is spaced from the source region 41. That spacing is ensured when the method described with respect to FIGS. 2(a) to 2(d) is incorporated in the production process. The layer 51 may be deposited by any conventional process, such as CVD, including metal organic chemical vapor deposition (MOCVD) or molecular beam epitaxial deposition (MBE).

In FIG. 5, a variation of the junction FET structure shown in FIG. 4 is schematically shown in cross-section. In FIG. 5, a semiconductor region 61 of opposite conductivity type from that of the active layer 3 is disposed within the active layer 3 rather than on the surface of the substrate 1 as in the layer 51 of FIG. 4. The doped semiconductor region 61 may be formed by diffusion of dopant impurities into the active layer 3 or, more preferably, in an ion implantation step carried out just before the deposition of the gate material 2'. Otherwise, the processing is the same as that described for the device of FIG. 4. The structures of FIGS. 4 and 5 are particularly applicable to GaAs FETs.

In FIG. 6, still another FET structure is shown. In addition to the elements of the FET of FIG. 1(d), the structure of FIG. 6 includes an electrically insulating layer 71 interposed between active layer 3 and gate electrode 2 on the surface of substrate 1. This MISFET structure is particularly useful for materials such as InP in which the preparation of rectifying junctions is sometimes difficult. The structure of FIG. 6 may be prepared by the same methods employed to prepare the structure of FIG. 4 except that a semi-insulating layer or an insulating layer, such as $SiO_2$, SiN, or a III-V semiconductor alloy having a larger band gap than the substrate, such as AlGaAs, on a GaAs substrate, is deposited on the surface of substrate 1 after the formation of the active layer 3 and before the deposition of the gate material 2'. As with the layer 51 of FIG. 4, the layer 71 is protected by the gate electrode 2 in subsequent processing steps.

The structures of FIGS. 4-6, like those of FIGS. 1(d), 2(d), and 3(d), provide significant performance advantages over the prior art FETs. The invention provides FETs that can be reproducibly manufactured with precision gate lengths, asymmetrically disposed gate electrodes spaced from the both the source and drain regions, asymmetrically doped source and drain regions, low gate-to-source resistances, high drain breakdown voltages, and improved high frequency performance.

I claim:

1. A method of making a field effect transistor comprising sequentially:
   forming an active layer of a first conductivity type in a semiconductor substrate at a surface of the substrate;
   forming a layer of a gate material on a portion of the surface of the substrate;
   implanting dopant impurities in the portion of the substrate not masked by the gate material layer to form a source region;
   depositing a first mask on the substrate over the source region and on a portion of the gate material and removing the unmasked gate material to define a gate electrode and expose the surface of the substrate adjoining the gate electrode at the side of the gate electrode opposite the source region;
   forming a second mask on a portion of the exposed surface of the substrate adjacent to the gate electrode at the side of the gate electrode that is opposite the source region;
   implanting dopant impurities in the portion of the substrate not masked by the first and second masks to form a drain region whereby the gate electrode is asymmetrically disposed relative to the source and drain regions; and
   removing the first and second masks and forming source and drain electrodes on the source and drain regions, respectively.

2. The method of claim 1 including implanting a higher concentration of dopant impurities in the source region than in the drain region.

3. The method of claim 1 including depositing a gate material that forms a Schottky barrier with the active layer.

4. The method of claim 1 including, after forming the active layer but before forming the gate material, depositing a semiconductor material of a second conductivity type to form a rectifying junction with the active layer.

5. The method of claim 1 including, after forming the active layer but before forming the gate material, forming a semiconductor region of a second conductivity type in the active layer to form a rectifying junction.

6. The method of claim 1 including, after forming the active layer but before depositing the gate material, depositing an electrically insulating layer on the substrate.

7. The method of claim 1 including, after forming the active layer but before depositing the gate material, depositing an electrically semi-insulating layer on the substrate.

8. The method of claim 1 including forming the gate electrode spaced from the source region.

9. The method of claim 1 including forming the gate electrode spaced from the source and drain regions wherein the gate electrode is closer to the source region than to the drain region.

10. The method of claim 1 including, after forming the gate material and before forming the source region, depositing a spacing film on the substrate adjacent to the gate material and on the gate material and removing the spacing film after forming the source region whereby the gate electrode is spaced from the source region.

11. The method of claim 1 including forming the second mask by depositing an electrically insulating material on the first mask and on the exposed surface of the substrate adjacent to the gate electrode at the side of the gate electrode opposite the source region and removing a portion of the electrically insulating material by etching, leaving a portion of the electrically insulating material on the substrate and contacting the first mask and the gate electrode at the side of the gate electrode opposite the source region as the second mask.

12. A method of making a field effect transistor comprising sequentially:
    forming an active layer of a first conductivity type in a semiconductor substrate at a surface of the substrate;
    forming a layer of a gate material on a portion of the surface of the substrate;
    implanting dopant impurities in the portion of the substrate not masked by the gate material layer to form a source region;
    depositing a first mask on the substrate over the source region and on a portion of the gate material and removing the unmasked gate material to define a gate electrode and expose the surface of the substrate adjoining the gate electrode at the side of the gate electrode opposite the source region;
    forming a second mask on a portion of the exposed surface of the substrate adjacent to the gate electrode at the side of the gate electrode that is opposite the source region;
    implanting dopant impurities in the portion of the substrate not masked by the first and second masks to form a drain region whereby the gate electrode is asymmetrically disposed relative to the source and drain regions;
    depositing a third mask on the surface of the substrate not masked by the first and second masks and on the first and second masks;
    opening an aperture in the third mask opposite the gate electrode to expose the gate electrode;
    depositing a relative low resistance contact layer on the gate electrode through the aperture in the third mask;
    removing the third mask; and
    removing the first and second masks and forming source and drain electrodes on the source and drain regions, respectively.

13. The method of claim including depositing the source and drain electrodes using the relatively low resistance contact layer as a mask.

14. The method of claim 12 including removing the second mask before depositing the source and drain electrodes.

15. The method of claim 12 including depositing, as the relatively low resistance contact layer, films selected from titanium/gold, titanium/molybdenum/gold, and titanium/platinum/gold.

16. The method of claim 12 including forming the second mask by depositing an electrically insulating material on the first mask and on the exposed surface of the substrate adjacent to the gate electrode at the side of the gate electrode opposite the source region and removing a portion of the electrically insulating material by etching, leaving a portion of the electrically insulating material on the substrate and contacting the first mask and gate electrode at the side of the gate electrode opposite the source region as the second mask.

* * * * *

UNITED STATES PATENT AND TRADEMARK OFFICE
CERTIFICATE OF CORRECTION

PATENT NO. : 5,036,017

DATED : July 30, 1991

INVENTOR(S) : Minoru Noda

It is certified that error appears in the above-identified patent and that said Letters Patent is hereby corrected as shown below:

Column 10, line 61, after "claim" insert --12--;

Signed and Sealed this

Twenty-third Day of March, 1993

*Attest:*

STEPHEN G. KUNIN

*Attesting Officer*     *Acting Commissioner of Patents and Trademarks*